(12) United States Patent
Zhu et al.

(10) Patent No.: US 12,266,866 B2
(45) Date of Patent: Apr. 1, 2025

(54) ADAPTIVE FREQUENCY SWEEPING METHOD AND ADAPTIVE FREQUENCY SWEEPING SYSTEM FOR FREQUENCY POINT SAMPLING, AND RELATED DEVICE

(71) Applicant: LANSUS TECHNOLOGIES INC., Guangdong (CN)

(72) Inventors: Yuquan Zhu, Guangdong (CN); Peng Guan, Guangdong (CN); Wenhan Zhou, Guangdong (CN); Ruizhi Yang, Guangdong (CN); Jinzhao Hu, Guangdong (CN); Jiashuai Guo, Guangdong (CN)

(73) Assignee: LANSUS TECHNOLOGIES INC., Shenzhen (CN)

( * ) Notice: Subject to any disclaimer, the term of this patent is extended or adjusted under 35 U.S.C. 154(b) by 0 days.

(21) Appl. No.: 18/813,047

(22) Filed: Aug. 23, 2024

(65) Prior Publication Data
US 2024/0413528 A1    Dec. 12, 2024

Related U.S. Application Data

(63) Continuation of application No. PCT/CN2023/126000, filed on Oct. 23, 2023.

(30) Foreign Application Priority Data

Nov. 9, 2022  (CN) .......................... 202211401494.5

(51) Int. Cl.
H01Q 3/22  (2006.01)
(52) U.S. Cl.
CPC .................................... *H01Q 3/22* (2013.01)
(58) Field of Classification Search
CPC ......... Y02D 30/70; G06F 30/20; G06F 17/10; H01Q 3/22
See application file for complete search history.

(56) References Cited

U.S. PATENT DOCUMENTS

2024/0393378 A1* 11/2024 Liu .................. G01R 23/18
2024/0405963 A1* 12/2024 Liu .................. H04L 7/0334

FOREIGN PATENT DOCUMENTS

| CN | 106199185 A | 12/2016 |
| CN | 107577872 A | 1/2018 |

(Continued)

OTHER PUBLICATIONS

Notification to Grant Patent Right for Invention, Chinese Application No. 202211401494.5, mailed Feb. 19, 2023 (3 pages).

(Continued)

*Primary Examiner* — Yuwen Pan
*Assistant Examiner* — Fatuma G Sherif

(57) ABSTRACT

An adaptive frequency sweeping method and an adaptive frequency sweeping system for frequency point sampling, and related devices, related to a technical field of wireless communication are provided, the adaptive frequency sweeping method is applied to simulation of radio frequency (RF) components. The adaptive frequency sweeping method for the frequency point sampling does not hinge upon specific numerical values and enables precise simulation at positions where frequency responses rapidly change while performing coarse simulation in areas that are not concerned about, thereby improving precision and efficiency of a design process for the RF components. Moreover, aiming at characteristics of Y parameters and S parameters in the frequency responses, different evaluation metrics are provided to reduce sampling points required for frequency sweeping and increasing a frequency sweeping speed.

9 Claims, 4 Drawing Sheets

(56) References Cited

FOREIGN PATENT DOCUMENTS

| | | | |
|---|---|---|---|
| CN | 111585658 A | 8/2020 | |
| CN | 111896802 A | 11/2020 | |
| CN | 114139372 A | 3/2022 | |
| CN | 114169174 A * | 3/2022 | ............ G06F 17/10 |
| CN | 114236383 A | 3/2022 | |
| CN | 114252767 A | 3/2022 | |
| CN | 114996969 A | 9/2022 | |
| CN | 115455745 A | 12/2022 | |
| WO | 2013010266 A1 | 1/2013 | |
| WO | 2014059890 A1 | 4/2014 | |
| WO | 2017084350 A1 | 5/2017 | |
| WO | WO-2020238780 A1 * | 12/2020 | ............ H03L 7/091 |

OTHER PUBLICATIONS

CNIPA, Office Action issued for Chinese Application No. 202211401494.5, mailed Dec. 21, 2022 (13 pages).
Lijuan Han et al., "Ningxia Engineering Technology", Simulation and analysis of transformer winding deformation parameters based on PSpice, Issue 02, pp. 110-114, date of issue Jun. 15, 2016.
Shiquan He et al., "Chinese Journal Of Radio Science", Broadband elctromagnetie simulation with a robust adaptive frequency sampling method, Issue 06, pp. 1022-1029, date of issue Dec. 15, 2014.

\* cited by examiner

ADAPTIVE FREQUENCY SWEEPING METHOD AND ADAPTIVE FREQUENCY SWEEPING SYSTEM FOR FREQUENCY POINT SAMPLING, AND RELATED DEVICE

TECHNICAL FIELD

The present disclosure relates to a technical field of wireless communications, and in particular to an adaptive frequency sweeping method and an adaptive frequency sweeping system for frequency point sampling, and related devices.

BACKGROUND

As wireless communication technologies develop, various consumer electronics have greater and greater demands on radio frequency (RF) devices, correspondingly, in a design process of the RF devices, designers have higher and higher requirements on frequency sweeping efficiency and frequency sweeping accuracy of simulation software. Generally, dense frequency sweeping points are capable of improving accuracy of a frequency sweeping curve, but may also improve a time for calculation. Therefore, an acceleration algorithm is required to reduce the time for calculation as much as possible on the premise of ensuring calculation precision.

Mainstream simulation software generally uses methods, such as Asymptotic Waveform Evaluation (AWE) and Adaptive Lanczos-Pade Sweep (ALPS) to improve calculation efficiency of frequency sweeping. In a finite element method (FEM), a basic principle of the foregoing methods is to perform calculation on frequency responses at several typical frequency points, and then approximate expansion is performed on an overall matrix through mathematical methods, such as Taylor series and Pade' Approximant, thereby estimating frequency responses at adjacent frequency points by very small computational overhead. However, there is a problem that expansion of the Taylor series for supporting the methods, such as the AWE, usually only has high estimation precision around sampling frequency points but has relatively poor estimation precision at positions far away from the sampling frequency points and positions where the frequency responses rapidly change, and the positions where the frequency responses rapidly change are usually key areas in a sampling process.

In actual simulation, there are usually high precision requirements on frequency responses of partial areas of frequency bands, such as a pass band, but not to other areas. Conventional estimation techniques typically divide the frequency bands into several narrower segments without discrimination, and then sweeping analyses are respectively performed on the several narrower segments, resulting in low efficiency. Therefore, the conventional estimation techniques may lack sufficient estimation accuracy in the positions where the frequency responses rapidly change and waste substantial computational resources on areas which are not the key areas in the sampling process. Moreover, the conventional estimation techniques generally hinge upon specific numerical simulation algorithms, for example, the AWE needs to decompose the overall matrix of the FEM to obtain an analytical expression of an electric filed value changing with a frequency. Such methods are not applicable in environments where explicit governing equations are absent, such as experimental measurements and machine learning.

SUMMARY

Embodiments of the present disclosure provide an adaptive frequency sweeping method and an adaptive frequency sweeping system for frequency point sampling, and related devices, aiming at solving problems that conventional frequency sweeping method generally hinge upon specific numerical values and are not suitable for scenarios, such as experimental measurements and machine learning.

In a first aspect, the embodiments of the present disclosure provide the adaptive frequency sweeping method for the frequency point sampling, applied to simulation of radio frequency (RF) components, including following steps.

S1: determining n frequency points to be sampled, n' final sampled frequency points, and a sampling range $[f_{min}, f_{max}]$ of the frequency point sampling, performing the frequency point sampling within the sampling range by a predetermined simulation method, and performing a first calculation on frequency responses at n sampling points, where a frequency response at a sampling point $x_n$ is denoted as f(x).

S2: performing a second calculation to obtain a first derivative of the frequency response f(x) and a second derivative of the frequency response f(x).

S3: estimating frequency response curves on the n sampling points according to the first derivative of the frequency response f(x) and the second derivative of the frequency response f(x) to obtain n−1 estimation curves, where an estimation curve corresponding to the sampling point $x_n$ is denoted as $g_{x_n}(x)$ and is applicable within a range $[x_{n-1}, x_{n+1}]$.

S4: sequentially obtaining a maximum error frequency point $x_p$ between estimation curves $g_{x_n}(x)$ and $g_{x_{n+1}}(x)$ of two adjacent sampling points until n−1 maximum error frequency points are obtained, where each of the n−1 maximum error frequency points has an error value.

S5: performing a third calculation on the error value of each of the n−1 maximum error frequency points according to a predetermined evaluation method to obtain an evaluation metric of each of the n−1 maximum error frequency points.

S6: ranking the n−1 maximum error frequency points according to each evaluation metric and selecting first m maximum error frequency points as sampled points, where m is less than n, and m and n are integers greater than 0; returning to the S2 for iterative execution if a cumulative number of the sampled points does not satisfy the n' final sampled frequency points; and stopping the iterative execution if the cumulative number of the sampled points satisfies the n' final sampled frequency points.

S7: outputting all the sampled points as final sampling points.

Furthermore, in the S1, the predetermined simulation method performs sampling within the sampling range by uniform sampling.

Furthermore, in the S2, the third calculation is performed by a central difference method to obtain the first derivative of the frequency response f(x) and the second derivative of the frequency response f(x).

Furthermore, in the S3, the estimation curve $g_{x_n}(x)$ satisfies following relationship (1):

$$g_{x_n}(x) = f(x_n) + f'(x_n) * (x - x_n) + 1/2 * f''(x_n) * (x - x_n)^2. \qquad (1)$$

Furthermore, in the S4, the maximum error frequency point $x_p$ satisfies following relationship (2):

$$x_p = (x_n + x_{n+1})/2; \quad (2)$$

and
the error value satisfies following relationship (3):

$$\text{Abs}[g_{x_n}(x_p) - g_{x_{n+1}}(x_p)]. \quad (3)$$

Furthermore, in the S5, a parameter type of the frequency response f(x) is admittance parameters (Y parameters), the predetermined evaluation method includes following steps.

S51: selecting a first sampling point $x_{max}$ with a maximum Y parameter value and a second sampling point $x_{min}$ with a minimum Y parameter value from the n sampling points to perform a fourth calculation to respectively obtain a maximum estimation curve $g_{x_{max}}(x)$ and a minimum estimation curve $g_{x_{min}}(x)$.

S52: obtaining a resonance point $x_r$ and an anti-resonance point $x_a$ according to the maximum estimation curve $g_{x_{max}}(x)$ and the minimum estimation curve $g_{x_{min}}(x)$, and adding the resonance point $x_r$ and the anti-resonance point $x_a$ to the n sampling points for the iterative execution.

S53: defining the evaluation metric of each of the n−1 maximum error frequency points as $F(x_p)$, and the evaluation metric $F(x_p)$ satisfies following relationship (4):

$$F(x_p) = \text{Abs}[g_{x_n}(x_p) - g_{x_{n+1}}(x_p)]. \quad (4)$$

In the S5, a parameter type of the frequency response f(x) is scattering parameters (S parameters), the predetermined evaluation method includes following steps.

S51: defining the S parameters as including a first S parameter and a second S parameter.

S52: performing a fifth calculation to respectively obtain an evaluation metric $F_{11}(x_p)$ of an estimation curve of the first S parameter and an evaluation metric $F_{21}(x_p)$ of an estimation curve of the second S parameter, where the evaluation metric $F_{11}(x_p)$ of the estimation curve of the first S parameter satisfies following relationship (5):

$$F_{11}(x_p) = \text{Abs}[g_{x_n}(x_p) - g_{x_{n+1}}(x_p)] / \text{Abs}[(g_{x_n}(x_p) + g_{x_{n+1}}(x_p))]^2; \quad (5)$$

and
the valuation metric $F_{21}(x_p)$ of the estimation curve of the second S parameter satisfies following relationship (6):

$$F_{21}(x_p) = \text{Abs}[g_{x_n}(x_p) - g_{x_{n+1}}(x_p)] * \text{Abs}[(g_{xn}(x_p) + g_{x_{n+1}}(x_p))]^2. \quad (6)$$

S53: defining the evaluation metric of each of the n−1 maximum error frequency points as $F(x_p)$, and the evaluation metric $F(x_p)$ satisfies following relationship (7):

$$F(x_p) = F_{11}(x_p) + F_{21}(x_p). \quad (7)$$

In a second aspect, the embodiments of the present disclosure further provides the adaptive frequency sweeping system for the frequency point sampling, applied to the simulation of the RF components. The adaptive frequency sweeping system for the frequency point sampling includes an initialization module, a differentiation module, a frequency response estimation module, a maximum error calculation module, an evaluation module, an iteration module, and an output module.

The initialization module is configured to determine the n frequency points to be sampled, the n' final sampled frequency points, and the sampling range $[f_{min}, f_{max}]$ of the frequency point sampling, perform the frequency point sampling within the sampling range by the predetermined simulation method, and perform the first calculation on frequency responses at the n sampling points, where the frequency response at the sampling point $x_n$ is denoted as f(x).

The differentiation module is configured to perform the second calculation to obtain the first derivative of the frequency response f(x) and the second derivative of the frequency response f(x).

The frequency response estimation module is configured to estimate the frequency response curves on the n sampling points according to the first derivative of the frequency response f(x) and the second derivative of the frequency response f(x) to obtain the n−1 estimation curves, where the estimation curve corresponding to the sampling point $x_n$ is denoted as $g_{x_n}(x)$ and is applicable within the range $[x_{n-1}, x_{n+1}]$.

The maximum error calculation module is configured to sequentially obtain the maximum error frequency point $x_p$ between adjacent estimation curves $g_{x_n}(x)$ and $g_{x_{n+1}}(x)$ until the n−1 maximum error frequency points are obtained, where each of the n−1 maximum error frequency points has the error value.

The evaluation module is configured to perform the third calculation on the error value of each of the n−1 maximum error frequency points according to the predetermined evaluation method to obtain the evaluation metric of each of the n−1 maximum error frequency points.

The iteration module is configured to rank the n−1 maximum error frequency points according to each evaluation metric, select the first m maximum error frequency points as sampled points, where m is less than n, and m and n are integers greater than 0, return to the frequency response estimation module for the iterative execution if the cumulative number of the sampled points does not satisfy the n' final sampled frequency points, and stop the iterative execution if the cumulative number of the sampled points satisfies the n' final sampled frequency points.

The output module is configured to output all the sampled points as the final sampling points.

In a third aspect, the embodiments of the present disclosure further provide a computer device, including a memory, a processor, and a computer program. The computer program is stored in the memory and executable on the processor, the processor executes the computer program to implement steps of the adaptive frequency sweeping method for the frequency point sampling as foregoing.

In a fourth aspect, the embodiments of the present disclosure further provides a computer-readable storage medium, the computer program is stored in the computer-readable storage medium, and the computer program is executed by the processor to implement the steps of the adaptive frequency sweeping method for the frequency point sampling as foregoing.

Beneficial effects of the present disclosure are as follows. The present disclosure provides the adaptive frequency sweeping method for the frequency point sampling that does not hinge upon specific numerical values. The adaptive frequency sweeping method for the frequency point sampling enables precise simulation at positions where the frequency responses rapidly change, while performing coarse simulation in areas that are not concerned about, thereby improving precision and efficiency of a design process for the RF components. Moreover, aiming at characteristics of the Y parameters and the S parameters in the frequency responses, different evaluation metrics are provided to reduce sampling points required for frequency sweeping and increasing a frequency sweeping speed.

DETAILED DESCRIPTION OF EMBODIMENTS

In order to make objectives, technical solutions, and advantages of the present disclosure clearer, the present disclosure are further described in detail below with reference to the accompanying drawings and embodiments. It should be understood that specific embodiments described herein are only used to explain the present disclosure and are not intended to limit the present disclosure.

Figure 1:
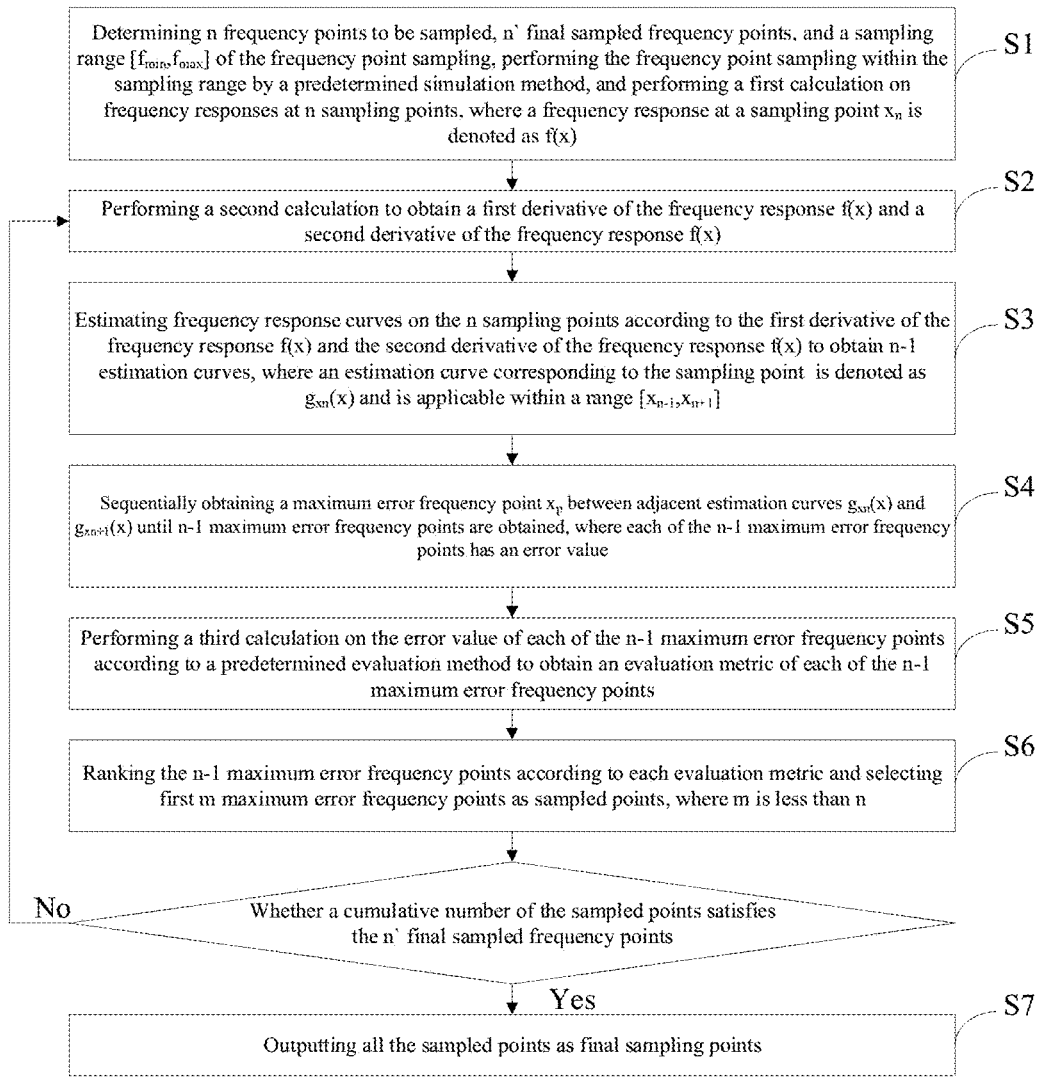
FIG. 1 is a flowchart of steps of an adaptive frequency sweeping method for frequency point sampling according to one embodiment of the present disclosure.

Please refer to FIG. 1, FIG. 1 is a flowchart of steps of an adaptive frequency sweeping method for frequency point sampling according to one embodiment of the present disclosure, the adaptive frequency sweeping method for the frequency point sampling is applied to simulation of radio frequency (RF) components. The adaptive frequency sweeping method for the frequency point sampling includes following steps.

S1: determining n frequency points to be sampled, n' final sampled frequency points, and a sampling range $[f_{min}, f_{max}]$ of the frequency point sampling, performing the frequency point sampling within the sampling range by a predetermined simulation method, and performing a first calculation on frequency responses at n sampling points, where a frequency response at a sampling point $x_n$ is denoted as $f(x)$.

Furthermore, in the S1, the predetermined simulation method performs sampling within the sampling range by uniform sampling.

Specifically, the predetermined simulation method is any one of numerical simulation calculation methods, such as Matlab.

S2: performing a second calculation to obtain a first derivative of the frequency response $f(x)$ and a second derivative of the frequency response $f(x)$.

Furthermore, in the S2, the third calculation is performed by a central difference method to obtain the first derivative of the frequency response $f(x)$ and the second derivative of the frequency response $f(x)$.

S3: estimating frequency response curves on the n sampling points according to the first derivative of the frequency response $f(x)$ and the second derivative of the frequency response $f(x)$ to obtain n−1 estimation curves, where an estimation curve corresponding to the sampling point $x_n$ is denoted as $g_{x_n}(x)$ and is applicable within a range $[x_{n-1}, x_{n+1}]$.

Specifically, when estimating the frequency response curves on the n sampling points according to the first derivative of the frequency response $f(x)$ and the second derivative of the frequency response $f(x)$, the estimation is performed between every two adjacent sampling points, and the n−1 estimation curves are obtained after being refined by expansion of the Taylor series.

Furthermore, in the S3, the estimation curve $g_{x_n}(x)$ satisfies following relationship (1):

$$g_{x_n}(x) = f(x_n) + f'(x_n)*(x - x_n) + 1/2*f''(x_n)*(x - x_n)^2. \quad (1)$$

S4: sequentially obtaining a maximum error frequency point $x_p$ between estimation curves $g_{x_n}(x)$ and $g_{x_{n+1}}(x)$ of two adjacent sampling points until n−1 maximum error frequency points are obtained, where each of the n−1 maximum error frequency points has an error value.

Specifically, any one sampling point $x_m$ in a range $[x_n, x_{n+1}]$ is capable of being predicted through the estimation curves $g_{x_n}(x)$ and $g_{x_{n+1}}(x)$ of two sampling points respectively at two sides of the one sampling point $x_m$, that is, being predicted through an estimation curve $g_{x_n}(x_m)$ and an estimation curve $g_{x_{n+1}}(x_m)$.

Meanwhile, in order to facilitate subsequent evaluation metric calculations and iterative calculations, in the embodiment of the present disclosure, through data validation, a value of the maximum error frequency point $x_p$ is determined to be a midpoint of the sampling points corresponding to the estimation curves for the calculations.

Furthermore, in the S4, the maximum error frequency point $x_p$ satisfies following relationship (2):

$$x_p = (x_n + x_{n+1})/2; \quad (2)$$

and
the error value satisfies following relationship (3):

$$\text{Abs}[g_{x_n}(x_p) - g_{x_{n+1}}(x_p)]. \quad (3)$$

S5: performing a third calculation on the error value of each of the n−1 maximum error frequency points according to a predetermined evaluation method to obtain an evaluation metric of each of the n−1 maximum error frequency points. Specifically, parameter types of the frequency response $f(x)$ are various, including scattering parameters (S parameters) and admittance parameters (Y parameter). Although parameters are fundamentally equivalent to two-port network parameters of a two-port network, however, processes for obtaining corresponding numerical values are different. In the embodiments of the present disclosure, a method of performing the third calculation varies according to different numerical types.

Furthermore, in the S5, when a parameter type of the frequency response f(x) is the Y parameters, the predetermined evaluation method includes following steps.

S51: selecting a first sampling point $x_{max}$ with a maximum Y parameter value and a second sampling point $x_{min}$ with a minimum Y parameter value from the n sampling points to perform a fourth calculation to respectively obtain a maximum estimation curve $g_{x_{max}}(x)$ and a minimum estimation curve $g_{x_n}(x)$.

S52: obtaining a resonance point $x_r$ and an anti-resonance point $x_a$ according to the maximum estimation curve $g_{x_{max}}(x)$ and the minimum estimation curve $g_{x_{min}}(x)$, and adding the resonance point x, and the anti-resonance point $x_a$ to the n sampling points for iterative execution.

S53: defining the evaluation metric of each of the n−1 maximum error frequency points as $F(x_p)$, and the evaluation metric $F(x_p)$ satisfies following relationship (4):

$$F(x_p) = \text{Abs}[g_{x_n}(x_p) - g_{x_{n+1}}(x_p)]. \quad (4)$$

After the resonance point $x_r$ and the anti-resonance point $x_a$ are added to the n sampling points for the iterative execution, sampling manners of the n sampling points gradually focus on positions of the resonance point $x_r$ and the anti-resonance point $x_a$, thereby achieving frequency sweeping of a target frequency band.

Correspondingly, the present disclosure further provides another embodiment, in the S5, when a parameter type of the frequency response f(x) is scattering parameters (S parameters), the predetermined evaluation method includes following steps.

S51: defining the S parameters as including a first S parameter and a second S parameter.

S52: performing a fifth calculation to respectively obtain an evaluation metric $F_{11}(x_p)$ of an estimation curve of the first S parameter and an evaluation metric $F_{21}(x_p)$ of an estimation curve of the second S parameter, where the evaluation metric $F_{11}(x_p)$ of the estimation curve of the first S parameter satisfies following relationship (5):

$$F_{11}(x_p) = \text{Abs}[g_{x_n}(x_p) - g_{x_{n+1}}(x_p)] / \text{Abs}[(g_{x_n}(x_p) + g_{x_{n+1}}(x_p))]^2; \quad (5)$$

and the valuation metric $F_{21}(x_p)$ of the estimation curve of the second S parameter satisfies following relationship (6):

$$F_{21}(x_p) = \text{Abs}[g_{x_n}(x_p) - g_{x_{n+1}}(x_p)] * \text{Abs}[(g_{xn}(x_p) + g_{x_{n+1}}(x_p))]^2. \quad (6)$$

S53: defining the evaluation metric of each of the n−1 maximum error frequency points as $F(x_p)$, and the evaluation metric $F(x_p)$ satisfies following relationship (7):

$$F(x_p) = F_{11}(x_p) + F_{21}(x_p). \quad (7)$$

S6: ranking the n−1 maximum error frequency points according to each evaluation metric and selecting first m maximum error frequency points as sampled points, where m is less than n, and m and n are integers greater than 0; returning to the S2 for the iterative execution if a cumulative number of the sampled points does not satisfy the n' final sampled frequency points; stopping the iterative execution if the cumulative number of the sampled points satisfies the n' final sampled frequency points.

Specifically, in the embodiments of the present disclosure, the n' final sampled frequency points are determined, and the S2 to the S6 are treated as a complete iteration. After each iteration, frequency estimation is performed based on originally divided sampling points to obtain a greater number of sampling points for calculations than in a previous iteration. Through multiple iterations and selecting a corresponding one of the n−1 maximum error frequency points satisfying each evaluation metric in each iteration as a sampling point, the target frequency band is efficiently sampled using fewer frequency points.

S7: outputting all the sampled points as final sampling points.

Figure 2:
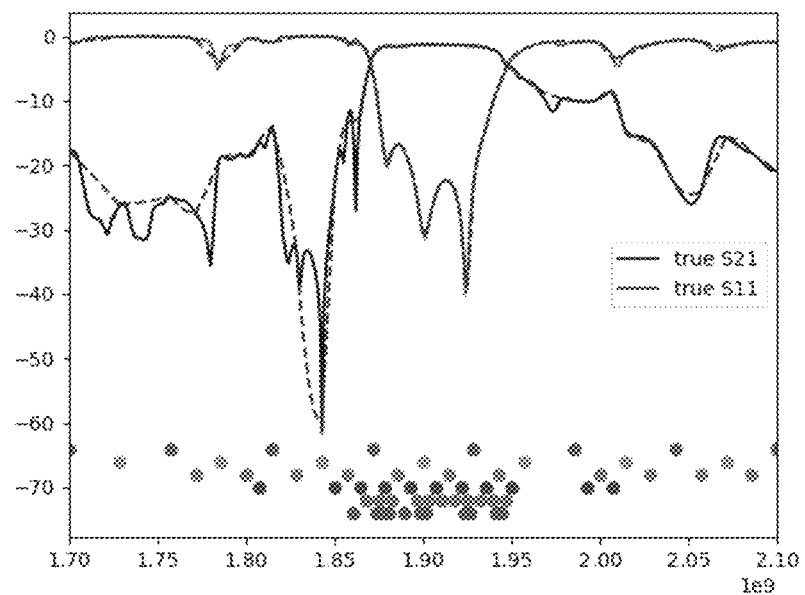
FIG. 2 is a schematic diagram illustrating sampling in scattering parameters (S parameters) of the adaptive frequency sweeping method for the frequency point sampling according to one embodiment of the present disclosure.
Figure 3:
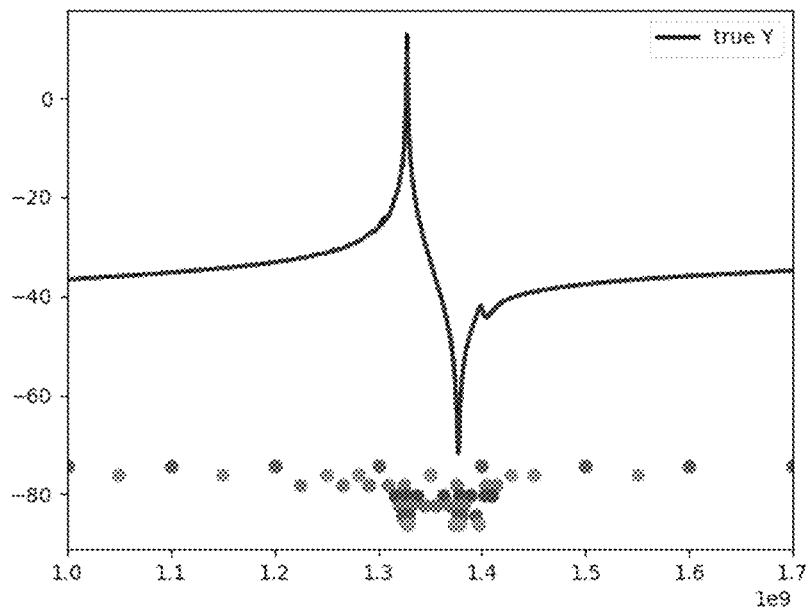
FIG. 3 is a schematic diagram illustrating sampling in admittance parameters (Y parameters) of the adaptive frequency sweeping method for the frequency point sampling according to one embodiment of the present disclosure.

For example, please to FIGS. 2-3, respectively illustrating sampling in S parameters and Y parameters of the adaptive frequency sweeping method for the frequency point sampling according to embodiments of the present disclosure, where for S parameters, a connecting line of sampling points in a pass band has high consistency with a real curve; for the Y parameter, a connection line of sampling points is substantially consistent with the real curve. As shown in FIG. 2 and FIG. 3, scatter points are point selected at each time of sampling, and a sampling batch thereof changes in a hierarchical manner. It can be seen that a first batch of the sampling points and a second batch of the sampling points are both embodied as uniform samples, but the sampling points in a third batch and the sampling points in subsequent batches are concentrated in a centralized area, and as shown in in FIGS. 2-3, the sampling points in the third batch and the sampling points in the subsequent batches gradually focus on an in-band area of the S parameters and the resonance point $x_r$ and the anti-resonance point $x_a$ of the Y parameters.

Beneficial effects of the present disclosure are as follows. The present disclosure provides the adaptive frequency sweeping method for the frequency point sampling that does not hinge upon specific numerical values. The adaptive frequency sweeping method for the frequency point sampling enables precise simulation at positions where the frequency responses rapidly change, while performing coarse simulation in areas that are not concerned about, thereby improving precision and efficiency of a design process for the RF components. Moreover, aiming at characteristics of the Y parameters and the S parameters in the frequency responses, different evaluation metrics are provided to reduce sampling points required for frequency sweeping and increasing a frequency sweeping speed.

Figure 4:
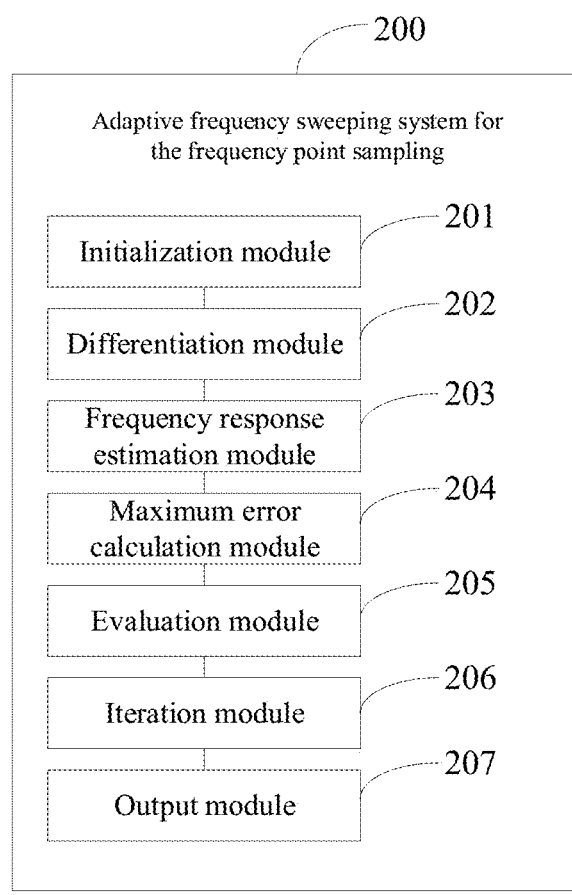
FIG. 4 is a structural schematic diagram of an adaptive frequency sweeping system for the frequency point sampling according to one embodiment of the present disclosure.

Embodiments of the present disclosure further provide an adaptive frequency sweeping system for the frequency point sampling, please refer to FIG. 4, FIG. 4 is a structural schematic diagram of the adaptive frequency sweeping system for the frequency point sampling according to one embodiment of the present disclosure, the adaptive frequency sweeping system 200 for the frequency point sampling includes an initialization module 201, a differentiation module 202, a frequency response estimation module 203, a maximum error calculation module 204, an evaluation module 205, an iteration module 206, and an output module 207.

The initialization module 201 is configured to determine the n frequency points to be sampled, the n' final sampled frequency points, and the sampling range $[f_{min}, f_{max}]$ of the frequency point sampling, perform the frequency point sampling within the sampling range by the predetermined simulation method, and perform the first calculation on frequency responses at the n sampling points, where the frequency response at the sampling point $x_n$ is denoted as $f(x)$.

The differentiation module 202 is configured to perform the second calculation to obtain the first derivative of the frequency response $f(x)$ and the second derivative of the frequency response $f(x)$.

The frequency response estimation module 203 is configured to estimate the frequency response curves on the n sampling points according to the first derivative of the frequency response $f(x)$ and the second derivative of the frequency response $f(x)$ to obtain the n−1 estimation curves, where the estimation curve corresponding to the sampling point $x_n$ is denoted as $g_{x_n}(x)$ and is applicable within the range $[x_{n-1}, x_{n+1}]$.

The maximum error calculation module 204 is configured to sequentially obtain the maximum error frequency point $x_p$ between adjacent estimation curves $g_{x_n}(x)$ and $g_{x_{n+1}}(x)$ until the n−1 maximum error frequency points are obtained, where each of the n−1 maximum error frequency points has the error value.

The evaluation module 205 is configured to perform the third calculation on the error value of each of the n−1 maximum error frequency points according to the predetermined evaluation method to obtain the evaluation metric of each of the n−1 maximum error frequency points.

The iteration module 206 is configured to rank the n−1 maximum error frequency points according to each evaluation metric, select the first m maximum error frequency points as sampled points, where m is less than n, and m and n are integers greater than 0, return to the frequency response estimation module for the iterative execution if the cumulative number of the sampled points does not satisfy the n' final sampled frequency points, and stop the iterative execution if the cumulative number of the sampled points satisfies the n' final sampled frequency points.

The output module 207 is configured to output all the sampled points as the final sampling points.

The adaptive frequency sweeping system 200 for the frequency point sampling is capable implementing steps in the adaptive frequency sweeping method for the frequency point sampling as foregoing, and is capable of achieving the same technical effect, please refer to foregoing embodiments, details are not repeated herein.

Figure 5:
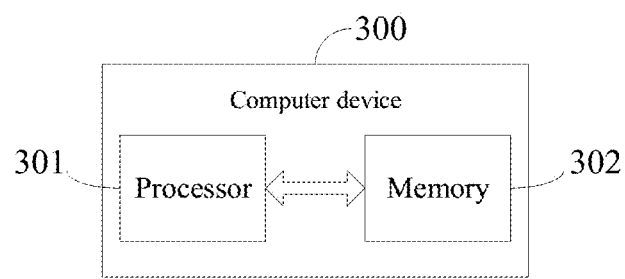
FIG. 5 is a structural schematic diagram of a computer device according to one embodiment of the present disclosure.

The embodiments of the present disclosure further provide a computer device, please refer to FIG. 5, FIG. 5 is a structural schematic diagram of the computer device according to one embodiment of the present disclosure. The computer device 300 includes a memory 302, a processor 301, and a computer program. The computer program is stored in the memory 302 and executable on the processor 301.

The processor 301 executes the computer program stored in the memory 302 to implement the steps of the adaptive frequency sweeping method for the frequency point sampling as foregoing, please refer to FIG. 1, specifically including the following steps.

S1: determining the n frequency points to be sampled, the n' final sampled frequency points, and the sampling range $[f_{min}, f_{max}]$ of the frequency point sampling, performing the frequency point sampling within the sampling range by the predetermined simulation method, and performing the first calculation on frequency responses at the n sampling points, where the frequency response at the sampling point $x_n$ is denoted as $f(x)$.

S2: performing the second calculation to obtain the first derivative of the frequency response $f(x)$ and the second derivative of the frequency response $f(x)$.

S3: estimating the frequency response curves on the n sampling points according to the first derivative of the frequency response $f(x)$ and the second derivative of the frequency response $f(x)$ to obtain the n−1 estimation curves, where the estimation curve corresponding to the sampling point $x_n$ is denoted as $g_{x_n}(x)$ and is applicable within the range $[x_{n-1}, x_{n+1}]$.

S4: sequentially obtaining the maximum error frequency point $x_p$ between the adjacent estimation curves $g_{x_n}(x)$ and $g_{x_{n+1}}(x)$ until the n−1 maximum error frequency points are obtained, where each of the n−1 maximum error frequency points has the error value.

S5: performing the third calculation on the error value of each of the n−1 maximum error frequency points according to the predetermined evaluation method to obtain the evaluation metric of each of the n−1 maximum error frequency points.

S6: ranking the n−1 maximum error frequency points according to each evaluation metric and selecting the first m maximum error frequency points as the sampled points, where m is less than n, and m and n are the integers greater than 0; returning to the S2 for the iterative execution if the cumulative number of the sampled points does not satisfy the n' final sampled frequency points; and stopping the iterative execution if the cumulative number of the sampled points satisfies the n' final sampled frequency points.

S7: outputting all the sampled points as the final sampling points.

Furthermore, in the S1, the predetermined simulation method performs the sampling within the sampling range by the uniform sampling.

Furthermore, in the S2, the third calculation is performed by the central difference method to obtain the first derivative of the frequency response $f(x)$ and the second derivative of the frequency response $f(x)$.

Furthermore, in the S3, the estimation curve $g_{x_n}(x)$ satisfies the following relationship (1):

$$g_{x_n}(x) = f(x_n) + f'(x_n) * (x - x_n) + 1/2 * f''(x_n) * (x - x_n)^2. \quad (1)$$

Furthermore, in the S4, the maximum error frequency point $x_p$ satisfies the following relationship (2):

$$x_p = (x_n + x_{n+1})/2; \quad (2)$$

and
the error value satisfies the following relationship (3):

$$\text{Abs}[g_{x_n}(x_p) - g_{x_{n+1}}(x_p)]. \quad (3)$$

Furthermore, in the S5, the parameter type of the frequency response $f(x)$ is the Y parameters, the predetermined evaluation method includes the following steps.

S51: selecting the first sampling point $x_{max}$ with the maximum Y parameter value and the second sampling point $x_{min}$ with the minimum Y parameter value from the n sampling points to perform the fourth calculation to respectively obtain the maximum estimation curve $g_{x_{max}}(x)$ and the minimum estimation curve $g_{x_{min}}(x)$.

S52: obtaining the resonance point $x_r$ and the anti-resonance point $x_a$ according to the maximum estimation curve $g_{x_{max}}(x)$ and the minimum estimation curve $g_{x_{min}}(x)$, and adding the resonance point x, and the anti-resonance point $x_a$ to the n sampling points for the iterative execution.

S53: defining the evaluation metric of each of the n−1 maximum error frequency points as $F(x_p)$, and the evaluation metric $F(x_p)$ satisfies the following relationship (4):

$$F(x_p) = \text{Abs}[g_{x_n}(x_p) - g_{x_{n+1}}(x_p)]. \quad (4)$$

In the S5, the parameter type of the frequency response f(x) is the S parameters, the predetermined evaluation method includes the following steps.

S51: defining the S parameters as including the first S parameter and the second S parameter.

S52: performing the fifth calculation to respectively obtain the evaluation metric $F_{11}(x_p)$ of the estimation curve of the first S parameter and the evaluation metric $F_{21}(x_p)$ of the estimation curve of the second S parameter, where the evaluation metric $F_{11}(x_p)$ of the estimation curve of the first S parameter satisfies the following relationship (5):

$$F_{11}(x_p) = \text{Abs}[g_{x_n}(x_p) - g_{x_{n+1}}(x_p)] / \text{Abs}[(g_{x_n}(x_p) + g_{x_{n+1}}(x_p))]^2; \quad (5)$$

and
the valuation metric $F_{21}(x_p)$ of the estimation curve of the second S parameter satisfies following relationship (6):

$$F_{21}(x_p) = \text{Abs}[g_{x_n}(x_p) - g_{x_{n+1}}(x_p)] * \text{Abs}[(g_{xn}(x_p) + g_{x_{n+1}}(x_p))]^2. \quad (6)$$

S53: defining the evaluation metric of each of the n−1 maximum error frequency points as $F(x_p)$, and the evaluation metric $F(x_p)$ satisfies the following relationship (7):

$$F(x_p) = F_{11}(x_p) + F_{21}(x_p). \quad (7)$$

The computer device in the embodiments of the present disclosure is capable implementing steps in the adaptive frequency sweeping method for the frequency point sampling as foregoing, and is capable of achieving the same technical effect, please refer to foregoing embodiments, details are not repeated herein.

The embodiments of the present disclosure further provides a computer-readable storage medium, the computer program is stored on the computer-readable storage medium, and the computer program is executed by the processor to implement processes and the steps of the adaptive frequency sweeping method for the frequency point sampling as foregoing and achieves the same technical effect, in order to avoid repetition, details are not repeated herein.

Those who skilled in the art should understand that all or some of the processes in the method in the foregoing embodiments may be implemented by instructing related hardware through a computer program, and the computer program may be stored in a computer-readable storage medium, and when the computer program is executed, a procedure of the embodiments of the foregoing methods may be included. The computer-readable storage medium may be a magnetic disk, an optical disk, a read-only memory (ROM), a random access memory (RAM), etc.

It should be noted that, in the specification, terms "include", "comprise", or any other variant thereof are intended to cover non-exclusive inclusion, so that a process, method, article, or apparatus that includes a series of elements includes not only those elements, but also other elements that are not explicitly listed, or elements inherent to the process, method, article, or apparatus. In the absence of more restrictions, s phrase "include a" does not exclude that there are additional identical elements in the process, method, article, or apparatus that includes the elements.

Through description of foregoing implementations, those who skilled in the art may clearly understand that the method in the foregoing embodiments may be implemented by means of software with a necessary general hardware platform, and certainly may also be implemented by hardware, but in many cases, the former is a better implementation. Based on this understanding, technical solutions of the present disclosure essentially or the part contributing to the prior art may be embodied in the form of a software product, and the software product is stored in a storage medium, such as the ROM/RAM, the magnetic disk, and the optical disk, and includes a plurality of instructions for enabling a terminal, such as a mobile phone, a computer, a server, an air conditioner, or a network device, to implement the method according to the embodiments of the present disclosure.

The embodiments of the present disclosure are described above with reference to the accompanying drawings, the disclosed embodiments are only preferred embodiments of the present disclosure, and the present disclosure is not limited to the specific embodiments described above, and the specific embodiments described above are merely illustrative and not restrictive, and those who skilled in the art may make many forms of equivalent changes without departing from a spirit of the present disclosure and a scope of claims, all of which fall within a protection of the present disclosure.

What is claimed is:

1. An adaptive frequency sweeping method for frequency point sampling, applied to simulation of radio frequency (RF) components, comprising:

S1: determining n frequency points to be sampled, n' final sampled frequency points, and a sampling range [$f_{min}$, $f_{max}$] of the frequency point sampling, performing the frequency point sampling within the sampling range by a predetermined simulation method, and performing a first calculation on frequency responses at n sampling points, wherein a frequency response at a sampling point $x_n$ is denoted as f(x);

S2: performing a second calculation to obtain a first derivative of the frequency response f(x) and a second derivative of the frequency response f(x);

S3: estimating frequency response curves on the n sampling points according to the first derivative of the frequency response f(x) and the second derivative of the frequency response f(x) to obtain n−1 estimation curves, wherein an estimation curve corresponding to the sampling point $x_n$ is denoted as $g_{x_n}(x)$ and is applicable within a range $[x_{n-1}, x_{n+1}]$;

S4: sequentially obtaining a maximum error frequency point $x_p$ between estimation curves $g_{x_n}(x)$ and $g_{x_{n+1}}(x)$ of two adjacent sampling points until n−1 maximum error frequency points are obtained, wherein each of the n−1 maximum error frequency points has an error value;

S5: performing a third calculation on the error value of each of the n−1 maximum error frequency points according to a predetermined evaluation method to obtain an evaluation metric of each of the n−1 maximum error frequency points;

S6: ranking the n−1 maximum error frequency points according to each evaluation metric and selecting first m maximum error frequency points as sampled points, wherein m is less than n, and m and n are integers greater than 0; returning to the S2 for iterative execution if a cumulative number of the sampled points does not satisfy the n' final sampled frequency points; stopping the iterative execution if the cumulative number of the sampled points satisfies the n' final sampled frequency points; and S7: outputting all the sampled points as final sampling points.

2. The adaptive frequency sweeping method for the frequency point sampling according to claim 1, wherein in the S1, the predetermined simulation method performs sampling within the sampling range by uniform sampling.

3. The adaptive frequency sweeping method for the frequency point sampling according to claim 1, wherein in the S2, the third calculation is performed by a central difference method to obtain the first derivative of the frequency response f(x) and the second derivative of the frequency response f(x).

4. The adaptive frequency sweeping method for the frequency point sampling according to claim 1, wherein in the S3, the estimation curve $g_{x_n}(x)$ satisfies following relationship (1):

$$g_{x_n}(x) = f(x_n) + f'(x_n) * (x - x_n) + 1/2 * f''(x_n) * (x - x_n)^2. \quad (1)$$

5. The adaptive frequency sweeping method for the frequency point sampling according to claim 4, wherein in the S4, the maximum error frequency point $x_p$ satisfies following relationship (2):

$$x_p = (x_n + x_{n+1})/2; \quad (2)$$

and
denoting the error value as $A_{x_p}$, the error value satisfies following relationship (3):

$$Ax_p = \text{Abs}[gx_n(xp) - gx_{n+1}(xp)]. \quad (3)$$

6. The adaptive frequency sweeping method for the frequency point sampling according to claim 5, wherein in the S5, a parameter type of the frequency response f(x) is admittance parameters (Y parameter), the predetermined evaluation method comprises:

S51: selecting a first sampling point $x_{max}$ with a maximum Y parameter value and a second sampling point $x_{min}$ with a minimum Y parameter value from the n sampling points to perform a fourth calculation to respectively obtain a maximum estimation curve $g_{x_{max}}(x)$ and a minimum estimation curve $g_{x_{min}}(x)$;

S52: obtaining a resonance point $x_r$ and an anti-resonance point $x_a$ according to the maximum estimation curve $g_{x_{max}}(x)$ and the minimum estimation curve $g_{x_{min}}(x)$, and adding the resonance point $x_r$ and the anti-resonance point $x_a$ to the n sampling points for the iterative execution; and S53: defining the evaluation metric of each of the n−1 maximum error frequency points as $F(x_p)$, and the evaluation metric $F(x_p)$ satisfies following relationship (4):

$$F(x_p) = \text{Abs}[g_{x_n}(x_p) - g_{x_{n+1}}(x_p)]. \quad (4)$$

7. The adaptive frequency sweeping method for the frequency point sampling according to claim 5, wherein in the S5, a parameter type of the frequency response f(x) is scattering parameters (S parameters), the predetermined evaluation method comprises:

S51: defining the S parameters as including a first S parameter and a second S parameter;

S52: performing a fifth calculation to respectively obtain an evaluation metric $F_{11}(x_p)$ of an estimation curve of the first S parameter and an evaluation metric $F_{21}(x_p)$ of an estimation curve of the second S parameter, wherein the evaluation metric $F_{11}(x_p)$ of the estimation curve of the first S parameter satisfies following relationship (5):

$$F_{11}(x_p) = \text{Abs}[g_{x_n}(x_p) - g_{x_{n+1}}(x_p)] / \text{Abs}[(g_{x_n}(x_p) + g_{x_{n+1}}(x_p))]^2; \quad (5)$$

and
the valuation metric $F_{21}(x_p)$ of the estimation curve of the second S parameter satisfies following relationship (6):

$$F_{21}(x_p) = \text{Abs}[g_{x_n}(x_p) - g_{x_{n+1}}(x_p)] * \text{Abs}[(g_{xn}(x_p) + g_{x_{n+1}}(x_p))]^2. \quad (6)$$

and
S53: defining the evaluation metric of each of the n−1 maximum error frequency points as $F(x_p)$, and the evaluation metric $F(x_p)$ satisfies following relationship (7):

$$F(x_p) = F_{11}(x_p) + F_{21}(x_p). \quad (7)$$

8. An adaptive frequency sweeping system for frequency point sampling, applied to simulation of RF components, comprising:

an initialization module, configured to determine n frequency points to be sampled, n' final sampled frequency points, and a sampling range $[f_{min}, f_{max}]$ of the frequency point sampling, perform the frequency point sampling within the sampling range by a predetermined simulation method, and perform a first calculation on frequency responses at n sampling points, wherein a frequency response at a sampling point $x_n$ is denoted as f(x);

a differentiation module, configured to perform a second calculation to obtain a first derivative of the frequency response f(x) and a second derivative of the frequency response f(x);

a frequency response estimation module, configured to estimate frequency response curves on the n sampling points according to the first derivative of the frequency response f(x) and the second derivative of the frequency response f(x) to obtain n−1 Estimation curves, wherein an estimation curve corresponding to the sampling point $x_n$ is denoted as $g_{x_n}(x)$ and is applicable within a range $[x_{n-1}, x_{n+1}]$;

a maximum error calculation module, configured to sequentially obtain a maximum error frequency point $x_p$ between adjacent estimation curves $g_{x_n}(x)$ and $g_{x_{n+1}}(x)$ until n−1 maximum error frequency points are obtained, wherein each of the n−1 maximum error frequency points has an error value;

an evaluation module, configured to perform a third calculation on the error value of each of the n−1 maximum error frequency points according to a predetermined evaluation method to obtain an evaluation metric of each of the n−1 maximum error frequency points;

an iteration module, configured to rank the n−1 maximum error frequency points according to each evaluation metric, select first m maximum error frequency points as sampled points, wherein m is less than n, and m and n are integers greater than 0, return to the frequency response estimation module for iterative execution if a cumulative number of the sampled points does not satisfy the n' final sampled frequency points, and stop the iterative execution if the cumulative number of the sampled points satisfies the n' final sampled frequency points; and an output module, configured to output all the sampled points as final sampling points.

9. A computer device, comprising:

a memory;

a processor; and a computer program;

wherein the computer program is stored in the memory and executable on the processor, the processor executes the computer program to implement steps of the adaptive frequency sweeping method for the frequency point sampling according to claim 1.

* * * * *